(12) United States Patent
Heliö et al.

(10) Patent No.: US 7,764,938 B2
(45) Date of Patent: Jul. 27, 2010

(54) SIGNALING GENERATION THROUGH MULTIPLEXING

(75) Inventors: Petri Heliö, Tampere (FI); Paavo Väänänen, Nokia (FI); Niko Mikkola, Tampere (FI); Jouni Kinnunen, Kangasala (FI)

(73) Assignee: Nokia Corporation, Espoo (FI)

( * ) Notice: Subject to any disclaimer, the term of this patent is extended or adjusted under 35 U.S.C. 154(b) by 828 days.

(21) Appl. No.: 11/707,865

(22) Filed: Feb. 20, 2007

(65) Prior Publication Data

US 2008/0070530 A1 Mar. 20, 2008

(30) Foreign Application Priority Data

Sep. 19, 2006 (FI) .................................. 20065571

(51) Int. Cl.
*H04B 1/06* (2006.01)
(52) U.S. Cl. ........................ 455/265; 455/255; 455/260; 331/2
(58) Field of Classification Search ......... 455/255–265; 331/1 A, 2, 3, 11, 176
See application file for complete search history.

(56) References Cited

U.S. PATENT DOCUMENTS

| | | | | |
|---|---|---|---|---|
| 4,479,249 A | * | 10/1984 | Geesen et al. ................. | 455/208 |
| 4,521,745 A | * | 6/1985 | Falconer .......................... | 331/2 |
| 5,148,122 A | * | 9/1992 | Karlquist ........................ | 331/3 |
| 5,319,680 A | * | 6/1994 | Port et al. ..................... | 375/375 |
| 5,396,521 A | * | 3/1995 | Minami ....................... | 455/260 |
| 6,006,078 A | * | 12/1999 | Yamamoto et al. .......... | 455/264 |
| 6,147,530 A | * | 11/2000 | Nogawa ....................... | 331/11 |
| 6,281,759 B1 | * | 8/2001 | Coffey ...................... | 331/1 A |
| 6,553,209 B1 | * | 4/2003 | Hornsby et al. ............... | 455/76 |
| 7,567,131 B2 | * | 7/2009 | Van De Beek et al. ......... | 331/2 |
| 2003/0184347 A1 | | 10/2003 | Haroun et al. | |
| 2004/0232994 A1 | * | 11/2004 | Barillet et al. ................. | 331/2 |
| 2007/0103249 A1 | * | 5/2007 | Lee ............................. | 331/176 |
| 2007/0173219 A1 | * | 7/2007 | Kim et al. .................... | 455/260 |

* cited by examiner

*Primary Examiner*—Lana N Le
(74) *Attorney, Agent, or Firm*—Squire, Sanders & Dempsey L.L.P.

(57) ABSTRACT

The proposed apparatus and is used for signal generation by multiplexing signals such that there appears no glitches in an output signal. The present apparatus utilizes the knowledge of phase difference between input oscillator signals being multiplexed in order to provide a glitchless output signal. The apparatus comprises a first selection circuit configured to synchronize its response to a first control signal to a next determined event of one of input oscillator signals and convey an input oscillator signal to its output in response to the first control signal. The apparatus comprises a similar selection circuit for each input oscillator signal being multiplexed. Outputs of the selection circuits may be connected to a combining circuit which combines the outputs, thus providing the glitchless output signal.

29 Claims, 4 Drawing Sheets

SIGNALING GENERATION THROUGH MULTIPLEXING

FIELD

The invention relates to switching or multiplexing of oscillator signals.

BACKGROUND

Frequency synthesizers are utilized for example in radio systems in which a radio frequency (RF) signal having properties defined by system specifications is always present. Quite often, a phase locked loop (PLL) is used to generate the RF signal. PLL is used to tune the RF signal into pre-defined system frequencies, and it is a very accurate solution for frequency synthesis.

FIG. 1 illustrates a simplified block diagram of PLL. Key components of PLL often include a voltage-controlled oscillator (VCO) 100, a phase/frequency detector 104 and division logic 102. VCO 100 provides an output RF signal, which is tuned by inputs received from the phase/frequency detector 104. The output signal of the VCO 100 is directed to the phase/frequency detector 104 through the division logic 102 which divides the RF signal into a lower frequency to enable the phase/frequency detector 104 to compare the output signal of the VCO 100 with a reference signal. The reference signal is typically provided by an accurate oscillator, for example a crystal oscillator, which oscillates on a frequency lower than that of the RF signal. The phase/frequency detector 104 compares the input signal received through the division logic 102 with the reference signal and tunes the VCO 100 accordingly. The purpose of the phase/frequency detector 104 is to tune the VCO 100 such that the phase/frequency of the input signals of the phase/frequency detector 104 remain as close to one another as possible.

The VCO 100 may provide its output signal with different phase shifts, and these output signals with different phases may be applied to a multiplexer provided between the VCO 100 and the frequency divider 102. FIG. 2 illustrates a simplified block diagram of such multiplexer 208. Quadrature input signals SIN I and SIN Q having a 90-degree phase difference are converted to square wave signals S1 and S2 in converters 202 and 204, respectively, and then input to an asynchronous multiplexer 208. As a result, signals S1 and S2 have a phase shift of ¼ of a period of the signals. The asynchronous multiplexer selects one of the signals as an output signal OUT under control of a selection control signal SEL. The signals S1, S2, and SEL are illustrated in FIG. 3A, and the output signal OUT is illustrated in FIG. 3B. In FIG. 3A, S1 is illustrated by a solid line, S2 by a dashed line, and SEL by a dotted line. At first, the asynchronous multiplexer 208 controlled by the selection control signal SEL selects signal S1 as the output signal OUT. After the point when selection control signal level changes from high to low, the multiplexer 208 selects signal S2 as the output signal OUT. FIG. 3B illustrates the result. At a moment just before the state of the selection control signal SEL changed, the level of signal S1 changed from low to high. The state of signal is low at the same moment. As can be seen in FIG. 3B, this causes a glitch to the output signal at time instant T1. The glitch may cause undesired effects in the components following the multiplexer 208 and generate spurious RF signals.

BRIEF DESCRIPTION OF THE INVENTION

An object of the invention is to provide an improved solution for signal generation.

According to an aspect of the invention, there is provided an apparatus, comprising an input interface configured to receive at least a first and a second input oscillator signal having the same frequency but different phases and a first and a second control signal. The apparatus further comprises a first selection circuit configured to provide a response to a change in the first control signal based on synchronization of the first selection circuit to a next determined event of one of the input oscillator signals and convey the first input oscillator signal to the output of the first selection circuit in response to the first control signal, and a second selection circuit configured to provide a response to a change in the second control signal based on synchronization of the second selection circuit to a next determined event of one of the input oscillator signals and convey the second input oscillator signal to the output of the second selection circuit in response to the second control signal.

According to another aspect of the invention, there is provided a radio device comprising the apparatus described above.

According to still another aspect of the invention, there is provided a method, comprising receiving at least a first and a second input oscillator signal having different phases and at least a first and a second control signal, providing a response to a change in the first control signal based on synchronization to a next determined event of one of the input oscillator signals and selecting the first input oscillator signal as a first output signal in response to the first control signal, and providing a response to a change in the second control signal based on synchronization to a next determined event of one of the input oscillator signals and selecting the second input oscillator signal as a second output signal in response to the second control signal.

According to yet another aspect of the invention, there is provided an apparatus, comprising a voltage-controlled oscillator configured to provide at least one oscillator signal. The apparatus further comprises a multiplexing circuit operationally coupled with the voltage-controlled oscillator and comprising an input interface configured to receive at least a first and a second input oscillator signal having the same frequency but different phases and a first and a second control signal, a first selection circuit configured to provide a response to a change in the first control signal based on synchronization of the first selection circuit to a next determined event of one of the input oscillator signals and convey the first input oscillator signal to the output of the first selection circuit in response to the first control signal, and a second selection circuit configured to provide a response to a change in the second control signal based on synchronization of the second selection circuit to a next determined event of one of the input oscillator signals and convey the second input oscillator signal to the output of the second selection circuit in response to the second control signal. The apparatus further comprises a frequency divider operationally coupled with the multiplexing circuit and configured to divide the frequency of an input oscillator signal by a pre-determined division factor, a reference signal generator configured to provide a reference oscillator signal, and a comparator circuit operationally coupled with the voltage-controlled oscillator, the frequency divider and the reference signal generator, configured to compare a signal received from the frequency divider with the reference oscillator signal received from the reference signal generator and output a control signal to control the voltage-controlled oscillator according to difference between the signal received from the frequency divider and the reference signal.

LIST OF DRAWINGS

In the following, the invention will be described in greater detail with reference to the embodiments and the accompanying drawings, in which FIG. 1 a generic block diagram of a phase locked loop frequency synthesizer;

DESCRIPTION OF EMBODIMENTS

Figure 4:
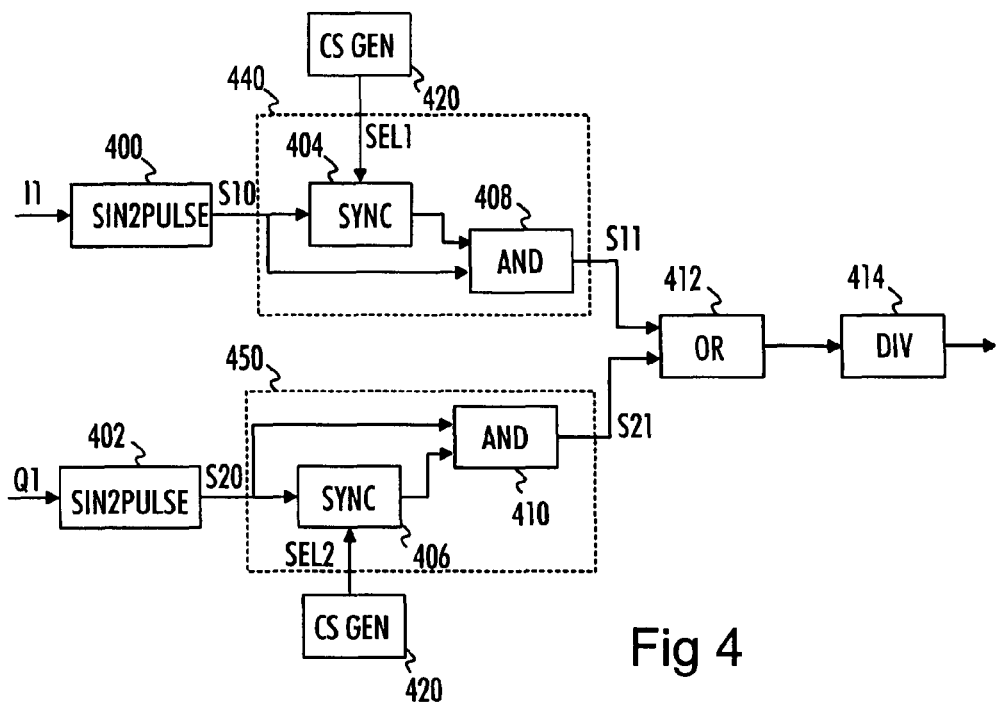
FIG. 4 illustrates a signal multiplexing circuit according to an embodiment of the invention.

With reference to FIG. 4, let us examine an example of an apparatus in which embodiments of the invention can be applied. Embodiments of the invention may preferably be implemented in radio telecommunication apparatuses but one skilled in the art may implement the teachings of this specification in other environments.

Let us in this specification assume that the embodiments of the invention are implemented in a signal multiplexing circuit of a signal generator (frequency synthesizer) based on a phase locked loop (PLL) structure. The signal generator may be built into a radio device, such as a mobile telephone, a base station, or any other mobile or fixed radio device.

The signal generator may be designed to provide an in-phase signal and a quadrature signal to be used in transmission and/or reception of radio signals. In more detail, the signal generator may be configured to provide an in-phase signal and a quadrature signal having the same frequency and a 90-degree phase shift between them. The signals may be radio frequency signals. Additionally, the signal generator may provide two other signals having phases opposite to those of the above signals, i.e. 180-degree and 270-degree phase shifts.

The multiplexing circuit according to an embodiment of the invention comprises an interface to receive a first and a second input oscillator signal I1 and Q1. The first and the second input oscillator signal I1 and Q1 may be the in-phase signal and the quadrature signal, respectively. The input oscillator signals may be received from, for example, a voltage-controlled oscillator of the PLL. The phase shift between the first and the second input oscillator signals is a known parameter and the structure of the multiplexing circuit is designed accordingly. The input oscillator signals I1 and Q1 may be sinusoidal signals having the same frequency. The interface may also receive a first and a second control signal SEL1 and SEL2 from a control signal generator 420. The control signals SEL1 and SEL2 are used for selecting an output signal of the multiplexing circuit.

Figure 5A:
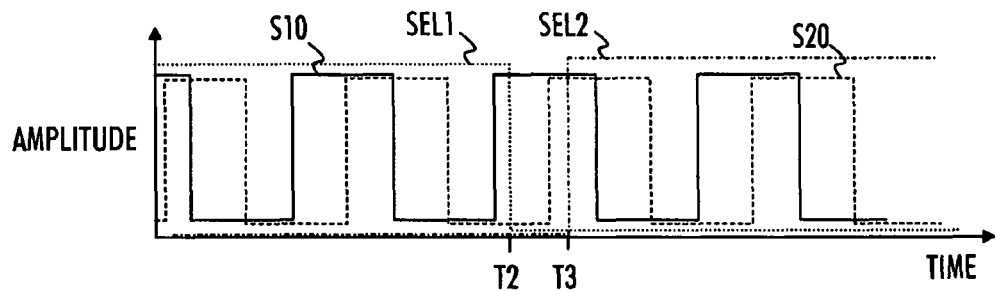
FIG. 5A illustrates signals associated with the signal multiplexing circuit of FIG. 4.
Figure 5A:
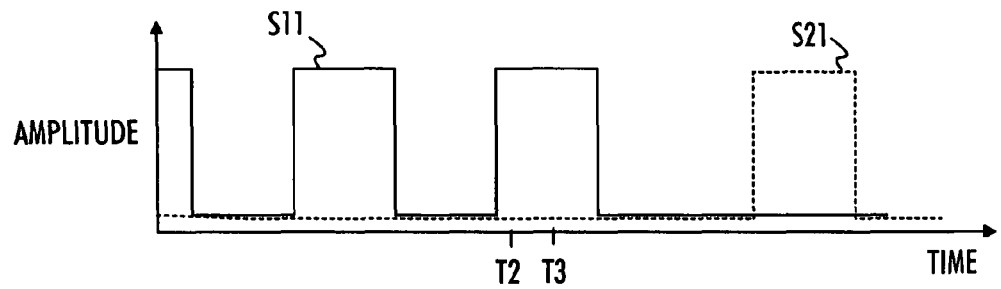
Figure 5A:
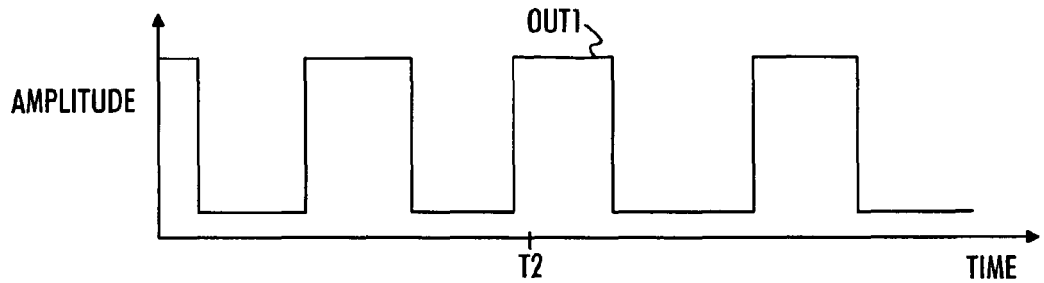

The sinusoidal input oscillator signals I1 and Q1 may be applied to signal converters 400 and 402, respectively, before applying them to the multiplexing circuit. Signal converters 400 and 402 may be configured to convert the input sinusoidal signals into square wave signals. Accordingly, a first signal converter 400 converts the sinusoidal first input oscillator signal I1 into a square wave signal S10 illustrated in the topmost diagram in FIG. 5A. Correspondingly, a second signal converter 402 converts the sinusoidal second input oscillator signal Q1 into a square wave signal S20 illustrated in the topmost diagram in FIG. 5. The 90-degree (or ¼ period) phase shift between the signals S10 and S20 may be seen in FIG. 5A. The first oscillator signal S10 output from the first signal converter 400 is applied to a first selection circuit 440 and the second oscillator signal S20 output from the second signal converter 420 is applied to a second selection circuit 450.

The first selection circuit 440 receives the first input oscillator signal S10 and the first control signal SEL1 as input signals. The first selection circuit 440 may convey the received first input oscillator signal S10 to its output in response to the first control signal SEL1. The first selection circuit is configured to synchronize its operation to a determined event of the first input oscillator signal S10 in order to prevent glitches at the output of the apparatus. The determined event refers to a determined change in the first input oscillator signal S10, i.e. rising or falling edge of the signal S10.

The first selection circuit 440 may comprise a synchronization circuit 404 and a logical AND gate 408. The input oscillator signal S10 is applied to an input of the synchronization circuit 404 and one of two inputs of the AND gate 408. The first control signal may be applied to another input of the synchronization circuit 404. An output of the synchronization circuit 404 may be connected to the other input of the AND gate 408, and an output of the AND gate 408 is the output of the first selection circuit 440.

The purpose of the synchronization circuit 404 is to synchronize an event in the first control signal SEL1 to the determined event in the first input oscillator signal S10. Accordingly, the synchronization circuit 404 synchronizes the operation of the first selection circuit 440 to the first input oscillator signal S10. The output of the synchronization circuit 404 controls the AND gate 408 to convey the input oscillator signal S10 to the output of the first selection circuit 440. The operation of the first selection circuit is now described with reference to signals illustrated in FIG. 5A. The first input oscillator signal S10 and the control signal SEL1 are illustrated in the topmost diagram as a solid line and a dotted line, respectively. At first, the first control signal SEL1 provided by the control signal generation unit 420 has its state (or level) high. As a response to the high state of the first control signal SEL1, the state (or level) of an output signal of the synchronization circuit 404 is also high. When the output signal of the synchronization circuit 404 is high, the AND gate 408 conveys the first input oscillator signal S10 to its output. The output signal of the AND gate 408 is denoted as S11 in FIGS. 4 and 5A.

Figure 3A:
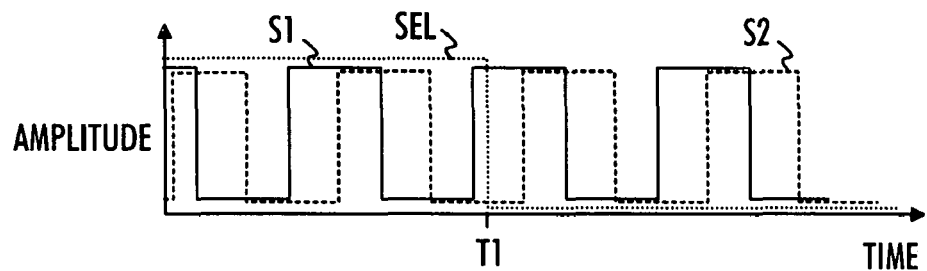
FIG. 3A illustrates signals associated with the block diagram of FIG. 2.
Figure 3B:
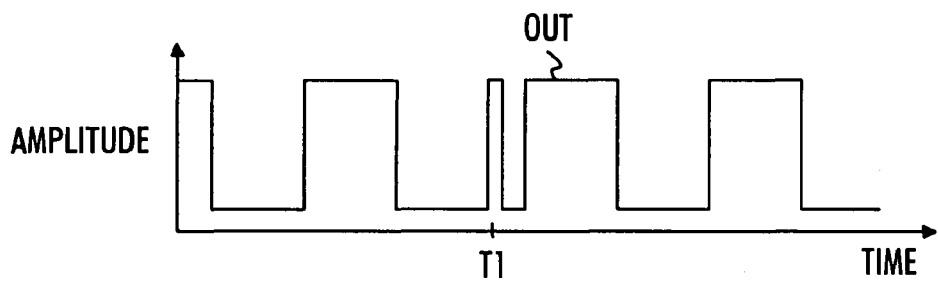
FIG. 3B illustrates an output signal of the block diagram of FIG. 2.

The control signal generation unit 420 switches the level of the first control signal from high to low at time instant T2. A change in the state of a signal is called an event in this description. Just before time instant T2, the level of the input oscillator signal S10 had changed from low to high. If the first selection circuit changed its output immediately as a response to the event in the first control signal, as done in a conventional solution described above with respect to FIG. 3, a glitch would appear at its output.

According to an embodiment of the invention, the synchronization circuit 404 synchronizes changing the state of its output signal to the determined event in the first input oscillator signal S10. In more detail, the synchronization circuit provides its response to a change in the first control signal SEL1 upon the next determined event following the change in the first control signal SEL1. In this example, the determined event to which the synchronization circuit 404 synchronizes its operation is the falling edge (the change of state (or level) from high to low), but it may equivalently be a rising edge (from low to high). Accordingly, the synchronization circuit 404 changes the state of its output signal from high to low when it detects the next falling edge in the first input oscillator signal S10. Then, the AND gate 408 will no more convey the first input oscillator signal to its output. Therefore, the state of the output signal S11 of the AND gate 408 remains low in the middle diagram of FIG. 5A after the next falling event following the time instant T2.

The operation of the second selection circuit 450 is similar to that of the first selection circuit 440. As mentioned above, the second selection circuit 450 receives the second input oscillator signal S20 as the input signal. The input signal may be directed to a synchronization circuit 406 and to a logical AND gate 410 (logically different from the synchronization circuit 404 and the AND gate 408, respectively). The second selection circuit 450 may receive a second control signal SEL2 as another input signal from the control signal generation unit 420. The second selection circuit 450 may convey the received second input oscillator signal S20 to its output in response to the second control signal SEL2. Similarly to the first selection circuit 440, the second selection circuit 450 synchronizes its operation to a determined event of the second input oscillator signal S20. The determined event may be the same as that of the first selection circuit 440, i.e. the falling edge of the second input oscillator signals S20 in this example. Accordingly, the first and the second selection circuit 440 and 450 operate independently from each other.

The second input oscillator signal S20 and the second control signal SEL2 are illustrated in the topmost diagram as a dashed line and a dash-dotted line, respectively. At first, the second control signal SEL2 provided by the control signal generation unit 420 has its state (or level) low. As a response to the low state of the second control signal SEL2, the state (or level) of an output signal of the synchronization circuit 406 is also low. When the output signal of the synchronization circuit 406 is low, the AND gate 410 does not convey the second input oscillator signal S20 to its output. The output signal of the AND gate 410 is denoted as S21 in FIGS. 4 and 5A.

The control signal generation unit 420 switches the level of the second control signal from low to high at time instant T3. Accordingly, the synchronization circuit 406 changes the state of its output signal from low to high when it detects the next falling edge in the second input oscillator signal S20. Then, the AND gate 410 will start to convey the second input oscillator signal S20 to its output. This is illustrated in the middle diagram of FIG. 5A in which the output signal S21 remains low until the next rising edge of the second input oscillator signal S20 following the time instant T3. While the second input oscillator signal S20 is conveyed to the output of the second selection circuit 450 at the next falling edge following the time instant T3, the output signal S21 is not high until the next rising edge due to that the second input oscillator signal S20 has its state low, as is obvious from the Figures.

Figure 1:
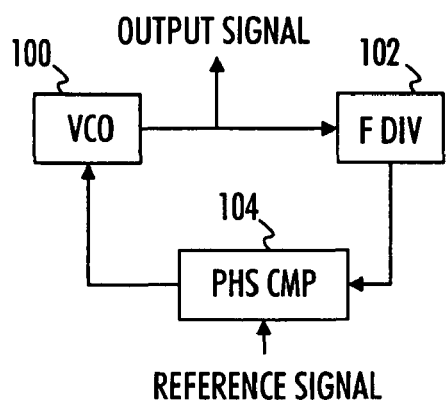
Figure 2:
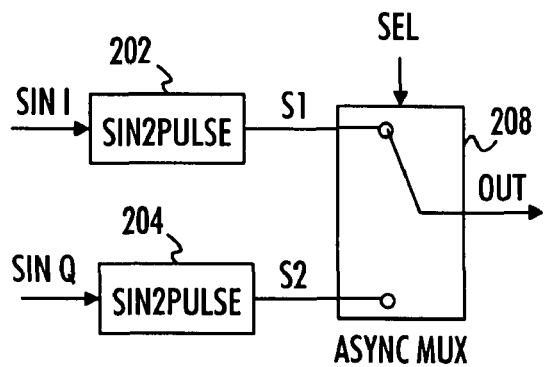
FIG. 2 illustrates a block diagram of an asynchronous signal multiplexing solution for frequency division in phase locked loops according to prior art.

Signals S11 and S21 are the inputs of a combining circuit 412 which combines the signals into one output signal OUT1 of the multiplexing circuit. The combining circuit 412 may simply be a logical OR gate. The output signal OUT1 of the combining circuit 412 is illustrated in the bottom diagram of FIG. 5A. As can be seen, the output signal OUT1 does not comprise any glitches even though the input signals S10 and S20 were the same as the input signals S1 and S2 in the example described with reference to FIGS. 2 and 3.

Figure 5B:
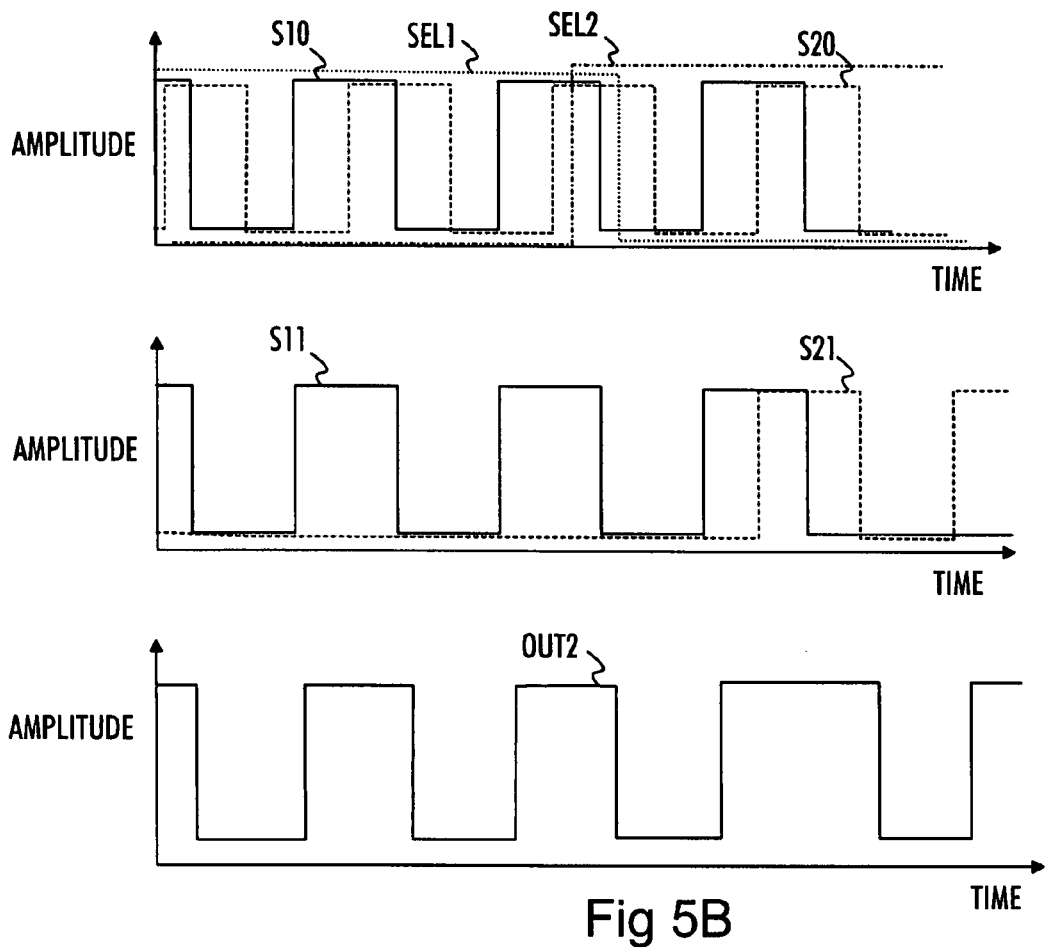
FIG. 5B illustrates another example signals associated with the signal multiplexing circuit of FIG. 4 and having a different timing than those illustrated in FIG. 5A.

As mentioned above, the control signal generation unit 420 provides both control signals SEL1 and SEL2. The control signal generation unit 420 may provide the changes in the first and the second control signal in an arbitrary order and in practice with an arbitrary delay between them. In the example described above with reference to FIG. 5A, the first input oscillator signal S10 is disconnected from the output of the multiplexing circuit before the second input oscillator signal S20 is connected to the output. In this case, the signal multiplexing is carried out according to "stop one before start the other procedure". It is not, however, necessary to disconnect one signal before connecting the other in order to prevent glitches. Let us assume, for example, that the change in the level of the first control signal SEL1 occurs half a period later than that illustrated in FIG. 5A. This example is illustrated in FIG. 5B. Now, the change (from high to low) in the first control signal SEL1 occurs just after the falling event of the first input oscillator signal S10. Accordingly, the first synchronization circuit 404 provides its response to this change upon the next falling event of the first input oscillator signal S10 following the change in the first control signals SEL1. In this case, the first selection circuit 440 stops conveying the first input oscillator S10 to its output after the second selection circuit 450 has started conveying the second input oscillator signal S20 to its output. Accordingly, the OR gate 412 receives the both signals S11 and S21 and provides its output according to the logical values of the signals S11 and S21. As can be seen in the output signal OUT1 illustrated in FIG. 5A, the output signal of the OR gate 412 stayed on the lower level a slightly prolonged time when the signal was switched in the previous example described above with reference to FIG. 5A. In the present example illustrated in FIG. 5B, the only difference is that the output signal OUT2 output from the OR gate 412 remains on the higher level for a longer time when the signal is switched from S10 to S20. Even if the first selection circuit 440 receives the control signal SEL1 indicating disconnection of the first input oscillator signal S10 several periods later than the time instant when the second selection circuit S20 receives the control signal SEL2 instructing the second selection circuit 450 to start to convey the second input oscillator signal S20 to its output, there will appear no glitches. During those periods when both signals are on, the combining circuit 412 provides an output signal in which the signal level is on the higher level for a longer time than on the lower level until the first selection circuit 440 stops the first input oscillator signal S10. Accordingly, the output signal OUT2 contains no glitches.

In practice, the first and the second control signal SEL1 and SEL2 may be produced from the same signal. The output signal OUT1 or OUT2 may be modified to produce the first control signal SEL1. The output signal OUT1 or OUT2 may be fed through an appropriate logic circuit to produce the first control signal SEL1. The changes in the first control signal SEL1 may be clocked according to the output signal OUT1 or OUT2. The second control signal SEL2 may then be generated by, for example, inverting the first control signal SEL1. The inversion may be performed in the multiplexing circuit, in which case the multiplexing circuit may receive only one control signal (the first and the second control signals SEL1 and SEL2 are logically the same signal), or outside the multiplexing circuit. As a consequence, delays between the changes of the first and the second control signals SEL1 and SEL2 are negligible due to their common origin. The multiplexing circuit provides, however, a glitch-free output signal even in that rare case. If more than two input oscillator signals are being multiplexed, the control signals may be generated from the same signal accordingly.

As can be seen from the examples above, a function of the selection circuits 440 and 450 is to ensure that the response to a change in an asynchronous control signal is provided at determined time instants, i.e. upon the occurrence of the next determined event (or change) in the corresponding input oscillator signals. Accordingly, the selection circuits 440 and 450 provide a fast and controlled response to the changes in the control signals. The combining circuit 412, on the other hand, handles the outputs of the selection circuits 440 and 450 to ensure a glitch-free output signal with an arbitrary delay between the changes in the first and the second control signals.

The output of the combining circuit 412 may be connected to a frequency divider 414 which may be implemented as a digital counter structure, for example. The frequency divider 414 may divide the frequency of an input signal by a fixed factor. The multiplexing circuit according to an embodiment of the invention may be used in the frequency division in addition to the frequency divider 414 to adjust the total frequency division factor. The multiplexing circuit affects the total frequency division factor through a proper multiplexing of its input signals (signals S10 and S20). Let us assume that the multiplexing circuit multiplexes initially signal S10 to its output and that the frequency division factor of the frequency divider is 2. If the multiplexing circuit continues conveying only the same signal S10 to its output, the total frequency division remains in 2. On the other hand, if the multiplexing circuit switches the other signal (signal S20) to its output within one clock period (continuous toggling, i.e. one phase shift per clock period), it raises the total frequency division factor above 2 (to 2.25 in the structure described in FIG. 4). This is caused by the delay between two consecutive rising (and falling) events at the time the output signal is switched from S10 to S20, which delays the counting in the frequency divider 414 and, accordingly, increases the frequency division factor. The frequency division through signal multiplexing as such is known to one skilled in the art and, thus, it is not described in more detail. Typically, in phase locked loops different phase shifts of an oscillator signal provided by the VCO are available. This may be implemented by providing a VCO that provides the oscillator signal with different phase shifts. Alternatively, the VCO may provide one oscillator signal having a doubled frequency. The oscillator signal may be fed to a division circuit which may divide the frequency of the oscillator signal by two and output the frequency-divided oscillator signal with different phase shifts.

While in the above example multiplexing of only two input oscillator signals was discussed, the number of input oscillator signals is generally higher. The number of input oscillator signals may be four, for example. The phases of the input oscillator signals may be 0, 90, 180, and 270 degrees, and the multiplexing may be performed in the following order: 0→90→180→270→0 . . . . The number of input oscillator signals may also be higher than four, which provides more flexibility to the multiplexing.

Signal generation according to an embodiment of the invention through intelligent multiplexing provides a glitch-free signal to the frequency divider 414, which prevents undesired effects caused by the glitches. Additionally, the glitch-free signal multiplexing may be implemented simply with synchronization circuits and logical gates. The provided solution is simple, fast, and power-efficient because there is no need to keep all the input oscillator signals active (only the selected one). Accordingly, the power consumption of the apparatus is reduced.

The signal generator according to an embodiment of the invention may comprise, in addition to the frequency-tunable VCO, the multiplexing circuit and the frequency divider 414, other components of the PLL. Accordingly, the signal generator may comprise at least a comparator circuit (a phase comparator) and a reference signal generator (a crystal oscillator). The comparator circuit may be operationally coupled with the output of the frequency divider 414 to receive a frequency-divided local oscillator signal. The comparator circuit may also receive a reference signal from the crystal oscillator, compare the signals, and provide an output signal to tune the frequency of the VCO. The PLL structure may also comprise additional frequency division or multiplication logic, if necessary.

Figure 6:
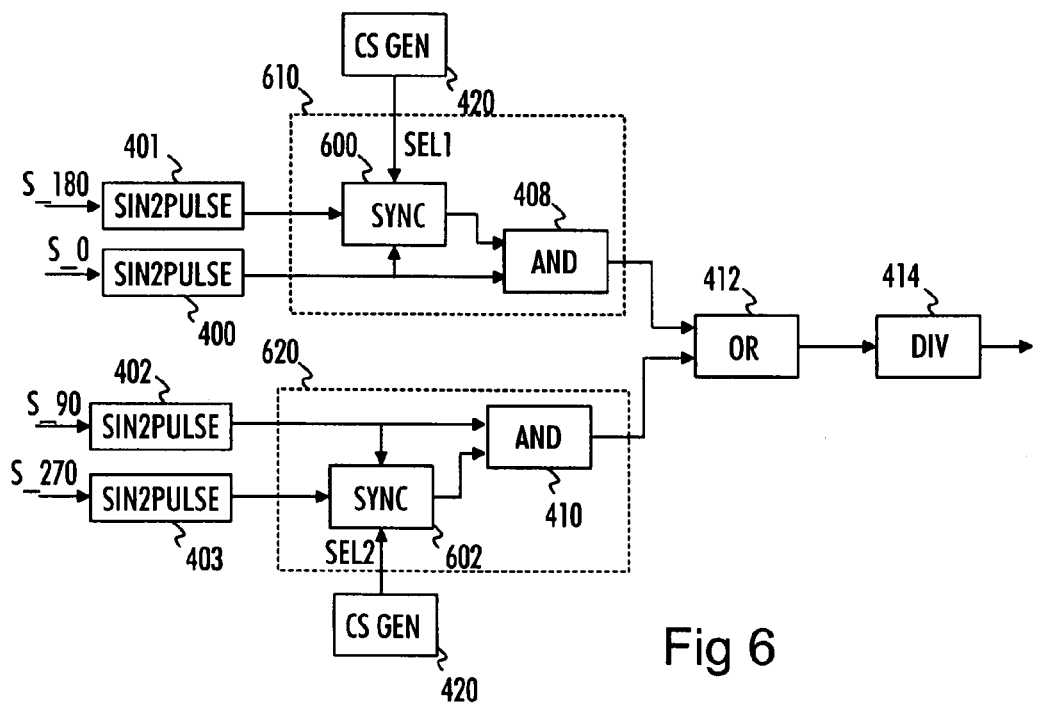
FIG. 6 illustrates a signal multiplexing circuit according to another embodiment of the invention.

While in the above description the operation of the selection circuits 440 and 450 is synchronized to the falling events of the respective input oscillator signals S10 and S20, their operation may be synchronized to the rising events as well. Furthermore, the operation of the selection circuits 440 and 450 may be synchronized to different input oscillator signals. FIG. 6 illustrates another embodiment of the invention in which the selection circuits synchronize to a different input signal than the one conveyed from their respective inputs to their respective outputs. The components denoted by the same numerals as those illustrated in FIG. 4 have the same functionalities.

As mentioned above, different phase shifts of an oscillator signal provided by the VCO are available. In this example, four different phase shifts of the oscillator signal are available. The available phase shifts are 0, 90, 180, and 270 degrees. Let us assume for simplicity that signals with phase shifts of 0 and 90 degrees correspond to the above-mentioned oscillator signals S10 and S20, respectively. A first selection circuit 610 (different from the first selection circuit 440) may receive two input oscillator signals S_0 and S_180 having zero and 180-degree phase shifts and, thus, opposite phases. The waveforms of these input oscillator signals S_0 and S_180 may be converted into square waves in signal converters 400 and 401 before they are input to the selection circuit 610. Both signals S_0 and S_180 are applied to the input of a synchronization circuit 600, and the signal S_0 is additionally applied to the input of an AND gate 408. Now, the synchronization circuit 600 is configured to synchronize its operation to a determined event (rising or falling edge) of one of the input oscillator signals (signal S_180) and convey the other input oscillator signal (signal S_0) to its output as a response to the control signal received from the control signal generator 420.

In a similar way, a second selection circuit 620 may be configured to receive square wave signals S_90 and S_270 and a control signal as input signals and synchronize its operation to an event (rising or falling) of one of the input signals (signal S_270) and convey the other input oscillator signal (signal S_90) to its output as a response to the control signal received from the control signal generator 420. The waveforms of sinusoidal input oscillator signals S_90 and S_270 may be converted into square waves in signal converters 402 and 403 before they are input to the selection circuit 610 as square wave signals. As can be seen from the description above, the operation of the selection circuits may be synchronized to any suitable input oscillator signal. The choice of an input oscillator signal to be synchronized is just a matter of design and may depend on the implementation (delays within logic circuits, etc.).

Signal multiplexing circuits according to embodiments of the invention described above comprise consecutive logical AND and OR gates. It is obvious to one skilled in the art that these gates may be replaced with other logical gates that result in an equivalent logical operation. In many implementations, logical AND and OR operations are replaced by NAND and/or NOR operations due to a simpler circuitry structure of the NAND and NOR gates. The implementation of the logical operations may affect the structure of the selection circuits 440, 450, 610, and 620. Therefore, it is to be understood that the selection circuits described above have that particular structure for the simplicity of the description.

Figure 7:
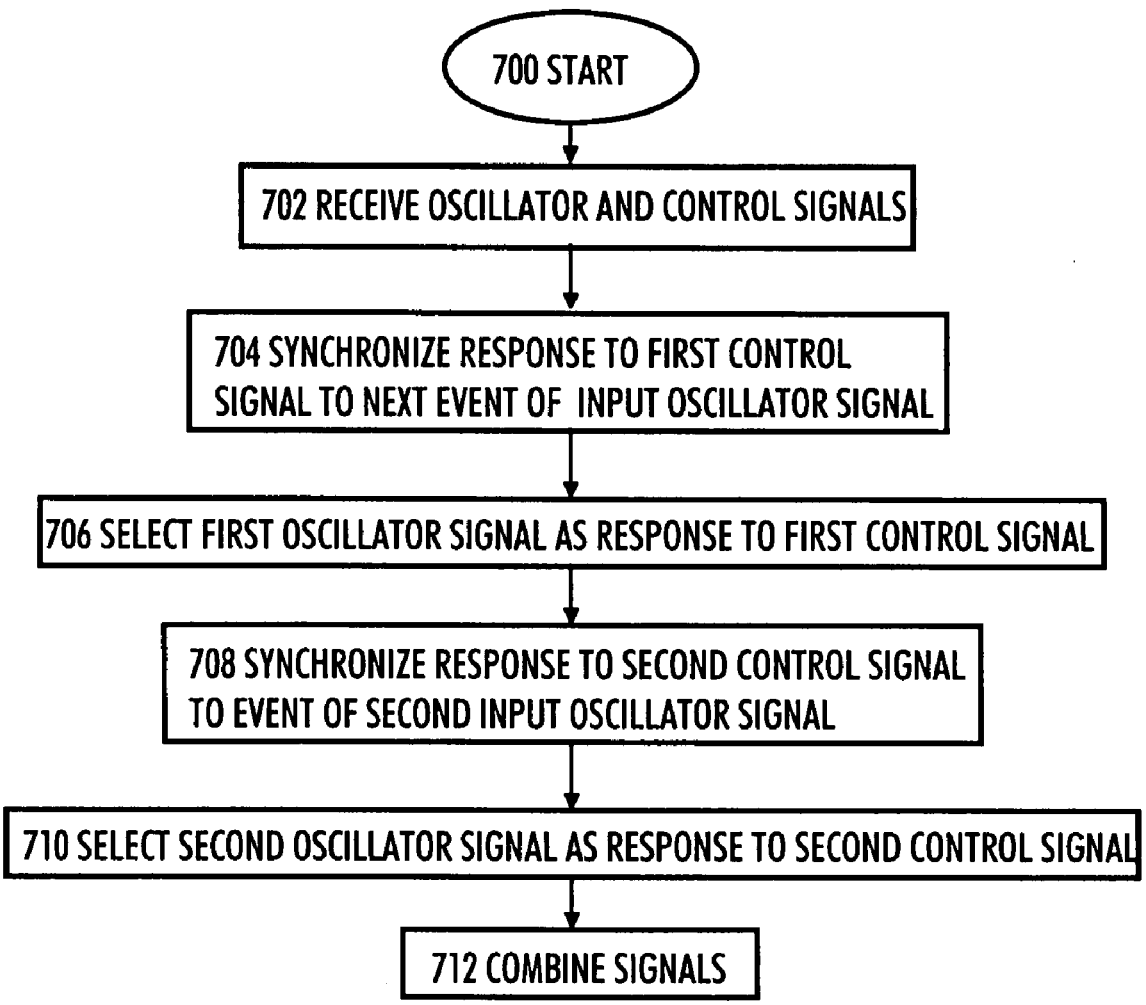
FIG. 7 is a flow diagram illustrating a signal generation procedure according to an embodiment of the invention.

FIG. 7 illustrates a signal generation procedure according to an embodiment of the invention. The procedure may be carried out in a signal multiplexing circuit described above with reference to FIG. 4. The signal multiplexing circuit may be a component of a frequency synthesizer. The frequency synthesizer may have the structure of a phase-locked loop. The procedure starts in block 700, and a first and a second oscillator signals and a first and a second control signals are received in block 702. The first and the second oscillator signals may have the same frequency but a different phase.

In block 704, a first synchronization circuit (circuit 404) synchronizes its operation to a determined event of the first input oscillator signal. The determined event may be a determined change in the first input oscillator signal (a rising or a falling edge). The first synchronization circuit may synchronize to another input oscillator signal as well (in that case, the synchronization circuit may be circuit 600).

The first synchronization circuit may be a part of a first selection circuit which selects the first input oscillator signal as a first output signal in response to the first control signal in block 706. The response to a change in the first control signal is synchronized to the next determined event of the first input oscillator signal and, thus, the selection of the first input oscillator signal is changed when the next determined event following the change in the first control signals occurs.

Similarly, a second synchronization circuit (circuit 406) synchronizes its operation to a determined event of the second input oscillator signal in block 708. The determined event may be a determined change in the second input oscillator signal (a rising or a falling edge). The determined event may be the same event as that of the first input oscillator signal in block 704. The second synchronization circuit may synchronize to another input oscillator signal as well (in that case, the synchronization circuit may be circuit 602).

The second synchronization circuit may be a part of a second selection circuit which selects the second input oscillator signal as a second output signal in response to the second control signal in block 710. The response to a change in the second control signal is synchronized to the next determined event of the second input oscillator signal and, thus, the selection of the second input oscillator signal is changed when the next determined event following the change in the second control signals occurs.

In block 712, the first and the second output signal are combined in a combining circuit (circuit 412) to produce a glitch-free output signal.

Even though the invention has been described above with reference to an example according to the accompanying drawings, it is clear that the invention is not restricted thereto but it can be modified in several ways within the scope of the appended claims.

The invention claimed is:

1. An apparatus, comprising:
an input interface configured to receive at least a first and a second input oscillator signal having the same frequency but different phases and a first and a second control signal;
a first selection circuit configured to provide a response to a change in the first control signal based on synchronization of the first selection circuit to a next determined event of one of the first and second input oscillator signals and convey the first input oscillator signal to an output of the first selection circuit in response to the first control signal; and
a second selection circuit configured to provide a response to a change in the second control signal based on synchronization of the second selection circuit to a next determined event of one of the first and second input oscillator signals and convey the second input oscillator signal to an output of the second selection circuit in response to the second control signal.

2. The apparatus of claim 1, further comprising:
a combining circuit operationally coupled to the outputs of the first and the second selection circuit and configured to combine the outputs of the first and the second selection circuit to provide an output signal.

3. The apparatus of claim 2, further comprising:
a frequency division circuit operationally coupled to an output of the combining circuit and configured to divide a frequency of the output signal of the combining circuit by a determined division factor, wherein an operation of the first and the second selection circuit controls an overall frequency division factor of the apparatus.

4. The apparatus of claim 1, wherein an operation of the second selection circuit is independent from an operation of the first selection circuit.

5. The apparatus of claim 1, wherein the first selection circuit comprises:
a synchronization circuit configured to synchronize its response to a change in the first control signal to the event of the first input oscillator signal and output a signal corresponding to the change in the first control signal upon detection of a next input oscillator signal event following the change in the first control signal, and
a logical AND gate having its input ports connected to an output of the synchronization circuit and the input of the first selection circuit.

6. The apparatus of claim 5, wherein the second selection circuit comprises:
a synchronization circuit configured to synchronize its response to a change in the second control signal to the event of the second input oscillator signal and output a signal corresponding to the change in the second control signal upon detection of a next input oscillator signal event following the change in the second control signal, and
a logical AND gate having its input ports connected to an output of the synchronization circuit and the input of the second selection circuit.

7. The apparatus of claim 6, wherein the apparatus further comprises a logical OR-gate operationally coupled to outputs of the AND gates of the first and the second selection circuit and configured to combine the outputs of the AND gates to provide an output signal.

8. The apparatus of claim 1, wherein the determined events of the input oscillator signals of the first and the second selection circuits are synchronized to the same events of the input oscillator signals.

9. The apparatus of claim 8, wherein the determined events of the input oscillator signals are the rising or falling edges of square wave input oscillator signals.

10. The apparatus of claim 1, further comprising:
a selection circuit for each one or more additional input oscillator signals, wherein an output of each selection circuit is connected to the combining circuit, and the input interface is configured to receive one or more additional input oscillator signals.

11. The apparatus of claim 10, wherein each selection circuit is configured to receive two input oscillator signals and a control signal, synchronize to the next determined event of one of the received input oscillator signals and convey the other input oscillator signal to the output of the selection circuit in response to the control signal.

12. The apparatus of claim 1, wherein the first selection circuit is configured to synchronize its response to the first control signal to the next determined event of the first input oscillator signal and the second selection circuit is configured to synchronize its response to the second control signal to the next determined event of the second input oscillator signal.

13. The apparatus of claim 1, wherein the apparatus is a phase locked loop.

14. The apparatus of claim 1, wherein the first and the second input oscillator signals are radio frequency signals.

15. A method, comprising:
receiving at least a first and a second input oscillator signal having different phases and at least a first and a second control signal;
providing a response to a change in the first control signal based on synchronization to a next determined event of one of the first and second input oscillator signals and selecting the first input oscillator signal as a first output signal in response to the first control signal; and
providing a response to a change in the second control signal based on synchronization to a next determined event of one of the first and second input oscillator signals and selecting the second input oscillator signal as a second output signal in response to the second control signal.

16. The method of claim 15, further comprising:
combining the first and the second output signals to provide a combined output signal.

17. The method of claim 16, further comprising:
dividing a frequency of the combined output signal; and
controlling a frequency division factor through a selection of the first and the second input oscillator signals.

18. The method of claim 15, wherein the selection of the first input oscillator signal is independent from the selection of the second input oscillator signal.

19. The method of claim 15, wherein the response to the first control signal is synchronized to the next determined event of the first input oscillator signal and the response to the second control signal is synchronized to the next determined event of the second input oscillator signal.

20. The method of claim 15, wherein the determined synchronization events of the input oscillator signals are the same events of the signals.

21. The method of claim 20, wherein the determined events of the input oscillator signals are the rising or falling edges of square wave input oscillator signals.

22. The method of claim 15, wherein the first and the second input oscillator signals are radio frequency signals having the same frequency.

23. The method of claim 15, further comprising:
receiving at least a third input oscillator signal having a phase different from those of the first and the second input oscillator signals; and
synchronizing the response to the first control signal to a determined event of the third input oscillator signal and selecting the first input oscillator signal as the first output signal in response to the first control signal upon the next event of the third input oscillator signal which event follows the change in the control signal.

24. The method of claim 15, wherein the method is carried out in a frequency synthesizer circuit based on a phase locked loop structure.

25. The method of claim 15, wherein the first and the second input oscillator signals are radio frequency signals.

26. An apparatus, comprising:
means for receiving at least a first and a second input oscillator signal having different phases and at least a first and a second control signal;
means for providing a response to a change in the first control signal based on synchronization to a next determined event of one of the first and second input oscillator signals and selecting the first input oscillator signal as a first output signal in response to the first control signal; and
means for providing a response to a change in the second control signal based on synchronization to a next determined event of one of the first and second input oscillator signals and selecting the second input oscillator signal as a second output signal in response to the second control signal.

27. An apparatus, comprising:
a voltage-controlled oscillator configured to provide at least one oscillator signal;
a multiplexing circuit operationally coupled with the voltage-controlled oscillator and comprising an input interface configured to receive at least a first input oscillator signal and a second input oscillator signal having the same frequency but different phases and a first and a second control signal, a first selection circuit configured to provide a response to a change in the first control signal based on synchronization of the first selection circuit to a next determined event of one of the first and second input oscillator signals and convey the first input oscillator signal to an output of the first selection circuit in response to the first control signal, and a second selection circuit configured to provide a response to a change in the second control signal based on synchronization of the second selection circuit to a next determined event of one of the first and second input oscillator signals and convey the second input oscillator signal to an output of the second selection circuit in response to the second control signal;
a frequency divider operationally coupled with the multiplexing circuit and configured to divide a frequency of an input oscillator signal by a pre-determined division factor and output a signal indicative thereof;
a reference signal generator configured to provide a reference oscillator signal; and
a comparator circuit operationally coupled with the voltage-controlled oscillator, the frequency divider and the reference signal generator, configured to compare the signal received from the frequency divider with the reference oscillator signal received from the reference signal generator and output a control signal to control the voltage-controlled oscillator according to a difference between the signal received from the frequency divider and the reference oscillator signal.

28. A radio device, comprising:

an input interface configured to receive at least a first and a second input oscillator signal having the same frequency but different phases and a first and a second control signal;

a first selection circuit configured to provide a response to a change in the first control signal based on synchronization of the first selection circuit to a next determined event of one of the first and second input oscillator signals and convey the first input oscillator signal to an output of the first selection circuit in response to the first control signal, and a second selection circuit configured to provide a response to a change in the second control signal based on synchronization of the second selection circuit to a next determined event of one of the first and second input oscillator signals and convey the second input oscillator signal to an output of the second selection circuit in response to the second control signal.

29. An apparatus, comprising:

voltage-controlled oscillator means for providing at least one oscillator signal;

multiplexing means operationally coupled with the voltage-controlled oscillator and comprising input interface means for receiving at least a first input oscillator signal and a second input oscillator signal having the same frequency but different phases and a first and a second control signal, first selection means for providing a response to a change in the first control signal based on synchronization of the first selection circuit to a next determined event of one of the first and second input oscillator signals and for conveying the first input oscillator signal to an output of the first selection circuit in response to the first control signal, and second selection means for providing a response to a change in the second control signal based on synchronization of the second selection circuit to a next determined event of one of the first and second input oscillator signals and for conveying the second input oscillator signal to an output of the second selection circuit in response to the second control signal;

frequency divider means operationally coupled with the multiplexing circuit and for dividing a frequency of an input oscillator signal by a pre-determined division factor and output a signal indicative thereof;

reference signal generator means for providing a reference oscillator signal; and comparator means operationally coupled with the voltage-controlled oscillator, the frequency divider and the reference signal generator for comparing the signal received from the frequency divider with the reference oscillator signal received from the reference signal generator and for outputting a control signal to control the voltage-controlled oscillator according to a difference between the signal received from the frequency divider and the reference oscillator signal.

* * * * *